United States Patent [19]

Iwasa

[11] Patent Number: 5,723,257
[45] Date of Patent: Mar. 3, 1998

[54] SI CONTAINING HIGH MOLECULAR COMPOUND AND PHOTOSENSITIVE RESIN COMPOSITION

[75] Inventor: Shigeyuki Iwasa, Toyko, Japan

[73] Assignee: NEC Corporation, Japan

[21] Appl. No.: 660,183

[22] Filed: May 31, 1996

[30] Foreign Application Priority Data

May 31, 1995 [JP] Japan ................... 7-133586

[51] Int. Cl.$^6$ ................... G03F 7/039
[52] U.S. Cl. ................... 430/270.1; 430/272.1; 528/10; 528/31; 528/32
[58] Field of Search ................ 430/170, 270.1, 430/272.1; 528/10, 31, 32

[56] References Cited

U.S. PATENT DOCUMENTS

| | | | |
|---|---|---|---|
| 4,507,384 | 3/1985 | Morita et al. | 430/270.1 |
| 4,600,685 | 7/1986 | Kitakohji et al. | 430/272.1 |
| 4,657,843 | 4/1987 | Fukuyama et al. | 430/270.1 |
| 4,722,881 | 2/1988 | Ueno et al. | 430/272.1 |
| 4,822,716 | 4/1989 | Onishi et al. | 430/270.1 |
| 4,981,778 | 1/1991 | Brault | 430/270.1 |
| 5,057,396 | 10/1991 | Tanaka et al. | 430/270.1 |
| 5,252,430 | 10/1993 | Hashimoto et al. | 430/270.1 |
| 5,338,818 | 8/1994 | Brunsvold et al. | 430/270.1 |
| 5,547,808 | 8/1996 | Watanabe et al. | 430/270.1 |

FOREIGN PATENT DOCUMENTS

| | | |
|---|---|---|
| 422570A2 | 8/1990 | European Pat. Off. |
| 62284352 | 10/1987 | Japan |
| 4-36755 | 2/1992 | Japan |
| 4058249 | 2/1992 | Japan |

OTHER PUBLICATIONS

Ito et al.; "Applications of Photoinitiators to the Design of Resists for Semiconductor Manufacturing"; 1984; pp. 11–23; American Chemical Society, Vol. 242.

Ueno et al.; "Short Wavelength Photoresist Material–Fine Processing for ULSI"; 1988; pp. 1–7, 16–21; 198–199; Bunshin Publication.

*Primary Examiner*—John S. Chu
*Attorney, Agent, or Firm*—Hayes, Soloway, Hennessey, Grossman & Hage, P.C.

[57] ABSTRACT

An Si containing high molecular compound is acquired by crosslinking acid obtained by polysilsesquioxane having a vinyl group in a side chain and alkoxysilane. This Si containing high molecular compound is expressed by a general formula given below

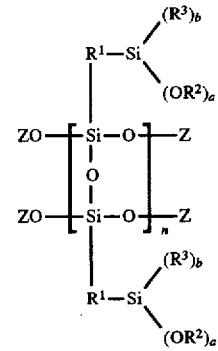

where $R^1$ represents a $C_2$–$C_8$ divalent saturated hydrocarbon group, $R^2$ represents a $C_1$–$C_8$ hydrocarbon group, $R^3$ represents a $C_1$–$C_8$ hydrocarbon group, Z represents a hydrocarbon atom or trimethylsilyl group, a is 1 to 3, b is 0 to 2 with a sum of a and b being 3, and n is a positive integer selected from 10 to 500. A photosensitive resin composition is obtained by combining the Si containing high molecular compound with a photoacid generator.

10 Claims, No Drawings

SI CONTAINING HIGH MOLECULAR COMPOUND AND PHOTOSENSITIVE RESIN COMPOSITION

BACKGROUND OF THE INVENTION

1. Field of the Invention

The present invention relates to a polysilsesquioxane having a functional group, which is crosslinked by an acid, in a side chain and a photosensitive resin composition containing polysilsesquioxane. More particularly, this invention relates to a pattern forming material which is used to form a pattern using deep UV light, such as a KrF excimer laser light of 248 nm or ArF excimer laser light of 193 nm, electron rays, X-rays or the like as exposure light.

2. Description of the Related Art

In the field of manufacturing various electron devices represented by VLSI, which require fine processing of the submicron order, as the density and the high integration of devices are being improved, there are keen demands for the photolithography technology to form fine patterns.

One way of miniaturizing patterns is to shorten the wavelength of exposure light which is used to form photoresist patterns. In general, the resolution RS of the optical system can be expressed by RS=k·ν/NA (where ν is the wavelength of the exposure light, NA is the number of apertures of the lens, and k is a process factor). It is apparent from this equation that the wavelength ν of the exposure light in the lithography should be shortened to reduce the value of RS.

Today, the manufacture of dynamic random access memories (DRAMs) having the integration of up to 64 Mbits requires the line and space resolution with the minimum pattern size of 0.35 μm and uses g rays of an Hg lamp (438 nm) and i rays (365 nm) as exposure light. The manufacture of DRAMs having the integration of greater than 256 Mbits requires a finer processing technique (processing size of 0.25 μm or smaller), so that it is considered effective to use light (deep UV light) of a shorter wavelength than that of the excimer laser light (KrF: 248 nm, ArF: 193 nm) or the like (see "Short Wavelength Photoresist Material—Fine Processing For ULSI" by Takumi Ueno, Takao Iwayanagi, Saburo Nonogaki, Hiroshi Ito and C. Grant Willson, Bunshin Publication, 1988). Particularly, active studies are being made on the KrF lithography.

The shortening of the wavelength of exposure light raises a problem of reducing the depth of focus that is given by DOF (Depth OF Focus)=ν/NA². As the fine processing on substrates in the advance development of devices becomes more complicated and accurate, steps on substrates becomes larger, making the pattern formation difficult by the conventional single-layer process.

As a solution to those problems, a multilayer resist scheme has been proposed. This method performs spin coating of a material, such as a phenol novolak resin or cresol novolak resin, which is easily dry-etched by oxygen plasma, to flatten the surface of a substrate, forms a pattern on the substrate with a resist having an oxygen resistant dry etching property, and then transfers the pattern to the underlying layer by anisotropic etching using oxygen plasma.

Because this method can acquire resist patterns with a high aspect ratio, studies on resist materials which have the oxygen resistant plasma etching property are being heated. Resist materials having Si atoms are excellent in the oxygen resistant plasma etching property and various kinds of Si containing resist materials have been reported. Particularly, polysilsesquioxane is characterized by the high ratio of an Si content and the excellent thermal stability, so that active studies are being made on resist materials which use it. One example of such resist materials essentially contains alkali soluble polysilsesquioxane which contains an acetyl group or hydroxyl group, as disclosed in Unexamined Japanese Patent Publication No. Hei 4-36755.

Further, the resist materials which are used in fine processing is strongly demanded for higher sensitivity as well as a for higher resolution to cope with the reduction of the processing sizes. This demand has arisen to improve the cost performance because an expensive excimer laser is used as the light source. As chemical amplification type resists using a photoacid generator can expect a significant improvement on the sensitivity, they are actively studied at present (e.g., American Chemical Society Symposium Series, vol. 242, pp. 11–23, 1984 by Hiroshi Ito and C. Grant Willson).

Chemical amplification type resists are characterized in that a protonic acid produced by a photoacid generator, which is contained in each resist and produces an acid by light irradiation, is moved in the resist's solid phase by a heat treatment after exposure to amplify the chemical change of a resist resin or the like by a factor of several hundreds to several thousands in the form of a catalytic reaction. The chemical amplification type resists have therefore achieved a significant high sensitivity as compared with the conventional resists whose photoreaction efficiency (reaction per photon) is less than 1. The transform of the resist solubility by chemical amplification is accomplished by some known methods, namely, a method of changing the solubility of a resin itself, a method of changing the solubility of an solution preventing agent (solution suppressor), or a method of changing the solubilities of a resin and a solution preventing agent.

Most of resists currently developed are chemical amplification type, so that the use of a chemical amplification mechanism is essential in the development of high-sensitivity materials to cope with the shortening of the wavelengths of exposure light sources.

Polysilsesquioxane has not however been much used as a chemical amplification type resist. Further, there hardly is any polysilsesquioxane, if used as a photosensitive resin composition, which can allow the use of deep UV light with a short wavelength of 220 nm or less as exposure light. This is because there is no polysilsesquioxane whose solubility to a developer is altered by chemical reaction and which has a high transparency against the short wavelength of 220 nm or less.

SUMMARY OF THE INVENTION

Accordingly, it is an object of the present invention to provide an Si containing high molecular compound whose solubility is easily altered by a protonic acid produced by a photoacid generator and which, when used as a photosensitive resin composition, can be used against light with a short wavelength of 220 nm or smaller, such as ArF light, as well as deep UV light with a wavelength of 220 nm or greater, such as KrF light, electron rays and X-rays, and a photosensitive resin composition containing such an Si containing high molecular compound.

The present inventors have made considerable studies on the conventional problems and have discovered that those problems can be solved by a novel high molecular compound which is expressed by a general formula (1) given below.

To achieve the above object, an Si containing high molecular compound according to this invention has a basic structure expressed by the following general formula (1)

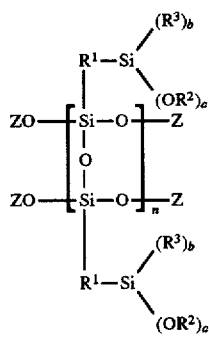

where $R^1$ represents a $C_2$–$C_8$ divalent saturated hydrocarbon group, $R^2$ represents a $C_1$–$C_8$ hydrocarbon group, $R^3$ represents a $C_1$–$C_8$ hydrocarbon group, Z represents a hydrocarbon atom or trimethylsilyl group, a is 1 to 3, b is 0 to 2 with a sum of a and b being 3, and n is a positive integer selected from 10 to 500.

A photosensitive resin composition according to this invention contains at least an Si containing high molecular compound and a photoacid generator as its basic structure, wherein the Si containing high molecular compound is expressed by the general formula (1) given above, and the photoacid generator serves to generate an acid by light irradiation and amplify a chemical change of a resist in the form of a catalytic reaction in a heat treatment after exposure.

In the general formula (1), $R^1$, which is a $C_2$–$C_8$ divalent saturated hydrocarbon group, is specifically an ethylene group, propylene group, butylene group, pentylene group, hexylene group, heptylene group, octylene group, cyclopentylene group, cyclohexylene group, cycloheptylene group, cyclooctylene group, cyclopentyl ethylene group, or cyclohexyl ethylene group. $R^2$, which is a $C_1$–$C_8$ hydrocarbon group, is specifically a methyl group, ethyl group, propyl group, butyl group, pentyl group, hexyl group, heptyl group, phenyl group, or methyl phenyl group, and $R^3$, which is a $C_1$–$C_8$ hydrocarbon group, is specifically a methyl group, ethyl group, propyl group, butyl group, pentyl group, hexyl group, heptyl group, phenyl group, or methyl phenyl group. In the general formula (1), as mentioned above, Z represents a hydrocarbon atom or trimethylsilyl group, a is 1 to 3, b is 0 to 2 with the sum of a and b being 3, and n is a positive integer selected from 10 to 500.

A high molecular compound embodying this invention is acquired by, for example, the following method. A hydrolyric reaction is performed on trihalidesilane, which is expressed by a general formula (2) (where $R^4$ is a $C_2$–$C_8$ hydrocarbon group and X is any one of F, Cl, Br and I atoms), in water or a mixed solution of water, dietyl ether and tetrahydrofuran (the preferable mixture ratio is 1:10 to 10:1) at a temperature of −10° C. to 100° C. (more specifically, at 10° C. immediately after the reaction starts and the temperature is raised thereafter) by using an organic base, such as trimethylamine, triethylamine or pyridine, or an inorganic base, such as potassium hydroxide, sodium hydroxyde, sodium carbonate or sodium hydrogencarbonate, as a catalyst. As a result, polysilsesquioxane, which is expressed by a general formula (3) (where $R^4$ is the same as the aforementioned one) and has a vinyl group in the side chain, is acquired.

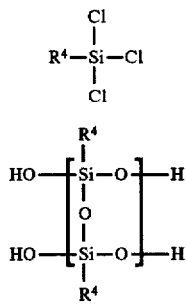

Subsequently, polysilsesquioxane expressed by the general formula (3) and alkoxysilane expressed by a general formula (4) (where $R^2$ and $R^3$ are the same as those mentioned above) are dissolved in a solvent, such as hexane, toluene or xylene, a transition metal catalyst, such as a rhodium catalyst like the Wilkinson complex (RhCl(P($C_6HR_5$)$_3$)$_3$), a platinum catalyst like a chloroplatinic acid ($H_2PtCl_6 \cdot 6_2O$), an Ni catalyst or a Pd catalyst, is added to the solution, and the resultant structure is then heated at 50° C. to 120° C. to perform an addition reaction of the Si—H group to the vinyl group. As a result, an Si containing high molecular compound which is expressed by the general formula (1) where Z is a hydrogen atom, is acquired.

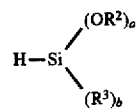

When the hydrogen group at the end is transformed to trimethylsilyl by a silylation agent like hexamethyldisilazane, a high molecular compound, which is given by the general formula (1) and has a trimethylsilyl group at the end, is obtained.

In the case where a resist is adjusted by using the Si containing high molecular compound expressed by the general formula (1) as the base polymer of the resist, the Si containing high molecular compound given by the general formula (1) should be combined with the proper photoacid generator and the resultant material should then be dissolved in the proper solvent.

A sulfonium salt compound, such as triphenyl sulfonium trifluoromethane sulfonate, triphenyl sulfonium trifluoromethane antimonate, triphenyl sulfonium benzosulfonate, cyclohexyl methyl (2-oxocyclohexyl) sulfonium trifluoromethane sulfonate, dicyclohexyl (2-oxocyclohexyl) sulfonium trifluoromethane sulfonate, dicyclohexylsulfonyl cyclohexanone, or dimethyl (2-oxocyclohexyl) sulfonium trifluoromethane sulfonate, iodonium salt, such as diphenyl iodonium trifluoromethane sulfonate, N-hydroxy succinimide trifluoromethane sulfonate, and the like are examples of the photoacid generator used in this invention, which is not however limited to those examples.

Although those available photoacid generators may be used singly, two or more kinds of the substances may be combined as a single photoacid generator. The ratio of the photoacid generator content is normally 0.2 to 25 parts by weight, preferably 1 to 15 parts by weight, with respect to 100 parts by weight of the entire solid material including the photoacid generator itself. With this ratio of the photoacid generator content being less than 0.5 part by weight, it is difficult to form a pattern. When the ratio of the photoacid generator exceeds 25 parts by weight, it is difficult to form a uniform coating film and a residual (scum) is apt to be produced after development.

The preferable solvent to be used in this invention is any organic solvent, which allows the substance, consisting of the Si containing high molecular compound expressed by the general formula (1) and the photoacid generator, to be sufficiently dissolved to yield a solution which can be used to form a uniform coating film by spin coating or the like. Available solvents may be used singly, or in combination of two or more kinds.

Examples of the solvent include methyl cellosolve acetate, ethyl cellosolve acetate, propylene glycol monoethyl ether acetate, methyl lactate, ethyl lactate, 2-methoxyethyl acetate, 2-ethoxyethyl acetate, methyl pyruvate, ethyl pyruvate, 3-methoxymethyl propionate, N-methyl-pyrrolidinone, cyclohexanone, cyclopentanone, methylethyl ketone, 1,4-dioxane, ethylene glycol monoethyl ether acetate, ethylene glycol monomethyl ether, ethylene glycol monoisopropyl ether, diethylene glycol monoethyl ether, diethylene glycol monoethyl ether, and the like. The solvent to be used in this invention is not however limited to those mentioned above.

While the basic constituting substances of the photosensitive resin composition of this invention is the Si containing high molecular compound expressed by the general formula (1), a photoacid generator and a solvent, further substances, such as a surfactant, dye, stabilizer, coating property modifying agent and pain, may be added as needed.

When the photosensitive resin composition embodying this invention is formed on a silicon substrate or the like by spin coating and is exposed to deep UV light such as ArF light whose wavelength is equal to or smaller than 220 nm, an acid produced from the photoacid generator in the exposed area causes an alkoxyl group in the Si containing high molecular compound expressed by the general formula (1) to be decomposed to a hydroxyl group, and the Si containing high molecular compound expressed by the general formula (1) is crosslinked for the dehydration and condensation with another hydroxyl group. As a result, the dissolution of the exposed portion to the solvent is disabled, so that a resist pattern can be acquired by performing development with the proper solvent. It is to be noted that a resist pattern can be likewise obtained by using deep UV light like KrF light whose wavelength is equal to or greater than 220 nm, electron rays or X-rays.

If the Si containing high molecular compound expressed by the general formula (1) is used as the top layer resist of a multi-layered resist, the oxygen resistant plasma etching property is high due to the high ratio of Si content, so that a pattern can be transferred to an underlying resist at a high precision by reactive ion etching using an oxygen gas.

DETAILED DESCRIPTION OF THE PREFERRED EMBODIMENTS

Comparative Examples and Examples of an Si containing high molecular compound according to the present invention will now be described.

Comparative Example 1

A synthetic example of polyvinylsilsesquioxane will be discussed below.

After what was inside a 500-ml three neck reactor equipped with an Allihn condenser, a three-way valve and a thermometer was substituted with an argon gas, 100ml of water and 32 ml (0.42 mol) of pyridine were put in the reactor after which the reactor was cooled down to 0° C. 20 g (0.124 mol) of vinyl trichlorosilane was gradually dropped in this solution while strongly stirring the solution with a magnetic stirrer under the atmosphere of the argon gas.

After the dropping was finished, stirring was carried out for two hours after which the temperature of the solution was raised to 20° C. in approximately 20 minutes. After stirring at 20° C. for 30 minutes, the solution was heated to 90° C. in approximately 15 minutes.

Then, stirring was carried out at 90° C. for 30 minutes, the solution was cooled down to the room temperature. A white precipitate produced in the three neck reactor was filtered to be isolated, and was dissolved into 30 ml of toluene. The resultant solution was dropped in 500 l of methanol and the resultant solution was dropped again in 1l of methanol after which reprecipitation was performed. After this process was repeated twice, the white precipitate was subjected to vacuum drying at 40° C. for eight hours, yielding 8.22 g of polyvinylsilsesquioxane (83% of yield).

The structure of the acquired product was checked by $^1$H-NMR measurement (by AMX-400 NMR device manufactured by VALQUA CORPORATION), IR measurement (by IR-470 manufactured by SHIMADZU CORPORATION), element analysis or the like. The molecular weight was measured by using Shimazu LC-9A and detection was carried out by using Shimazu SPD-6A with tetrahydrofuran as a solvent and using GPC column (GPC KF-80M) manufactured by SHOWA DENKO K. K. The molecular weight was determined as the reduced molecular weight of polystyrene.

$^1$H-NMR (CDCl$_3$, internal standard substance: tetramethylsilane): 6 (ppm) 5.8 to 6.0 (m, —CH=CH$_2$)

IR (KBr tablet, cm$^{-1}$): 1040 ($v_{Si-O-Si}$), 1600 ($v_{-CH=CH2}$)

Weight-average molecular weight: 4800

| Analyzed elements | C | H | Si |
| --- | --- | --- | --- |
| Measured value (weight %) | 30.11 | 3.74 | 35.58 |
| Theoretical value (weight %) | 30.36 | 3.82 | 35.49 |

Comparative Example 2

A synthetic example of polyvinylsilsesquioxane will be discussed below.

67.5 g (0.8 mol) of sodium hydrogencarbonate, 200 ml of diethyl ether and 200 ml of water were put in a 1—1 three neck reactor after which the reactor was cooled down to 0° C. and the resultant solution was strongly stirred. A solution of 39.5 g (0.225 mol) of vinyl trichlorosilane dissolved in 100 ml of diethyl ether was dropped in the stirred solution in 30 minutes. It should be noted that the reaction liquid while dropping was kept at 10° C. or lower.

After the dropping was finished, stirring was further carried out for two hours at 0° C. after which the diethyl ether layer and water layer were isolated by decantation. The water layer was extracted three times. The previously isolated diethyl ether layer and the extraction liquid were mixed and the mixture was cleaned two times with a saturated solution of salt. Then, the resultant solution was dried on anhydrous magnesium sulfate for 12 hours. The resultant product was subjected to solvent extraction under reduced pressure, thus yielding 14.3 g of a colorless oily material (74% of yield).

Subsequently, 5 g of the oily material was dissolved in 5 ml of MIBK in a 300 -ml three neck reactor. 0.5 ml of triethylamine was added to the solution and the resultant solution was reacted at 40° C. for eight hours while being stirred with a magnetic stirrer. The reaction product was dropped in 300 ml of methanol, producing a white precipitate. The while precipitate was filtered and was dissolved in 10 g of toluene. The resultant solution was dropped in 300 ml of methanol to cause precipitation again. The yielded white precipitate was filtered and was subjected to vacuum drying at the room temperature for 24 hours, yielding 4.1 g of polyvinylsilsesquioxane, a while solid, (60% of yield).

$^1$H-NMR (CDCl$_3$, internal standard substance: tetramethylsilane): δ (ppm) 5.8 to 6.0 (m, —CH=CH$_2$)

IR (KBr tablet, cm$^{-1}$): 1040 ($v_{Si-O-Si}$), 1600 ($v_{-CH=CH2}$)

Weight-average molecular weight: 53900

| Analyzed elements | C | H | Si |
|---|---|---|---|
| Measured value (weight %) | 30.42 | 3.70 | 35.82 |
| Theoretical value (weight %) | 30.36 | 3.82 | 35.49 |

Comparative Example 3

Synthesis was executed in the same way as done for Comparative Example 1 except that 20.1 g (0.124 mol) of allytrichlorosilane was used instead of 20 g of vinyl trichlorosilane. As a result, 10.8 g of polyvinylsilsesquioxane was obtained (86% of yield).

$^1$H-NMR (CDCl$_3$, internal standard substance: tetramethylsilane): δ (ppm) 1.8 to 2.0 (m, 2H, Si—CH), 4.7 to 5.0 (m, H, —CH=), 5.5 to 6.0 ( m, 3H, =CH$_2$), IR (KBr tablet, cm$^{-1}$): 1130 ($v_{Si-O-Si}$), 1640 ($v_{-CH=2}$)

Weight-average molecular weight: 5220

| Analyzed elements | C | H | Si |
|---|---|---|---|
| Measured value (weight %) | 38.98 | 5.88 | 30.37 |
| Theoretical value (weight %) | 38.68 | 5.41 | 30.15 |

Comparative Example 4

Synthesis was executed in the same way as done for Comparative Example 1 except that 26.9 g (0.124 mol) of hexa-5-enyltrichlorosilane was used instead of 20 g of vinyl trichlorosilane. As a result, 7.33 g of polyhexa-5-enyltrichlorosilane was obtained (74% of yield).

$^1$H-NMR (CDCl$_3$, internal standard substance: tetramethylsilane): δ (ppm) 0.45 to 0.85 (w, 3H, Si—CH$_2$—), 1.5 to 2.05 (m, 4H, —CH$_2$—), 4.7 to 5.0 (m, H, —CH=), 5.5 to 6.0 (m, 3H, =CH$_2$), IR (KBr tablet, cm$^{-1}$): 1050 ($v_{Si-O-Si}$), 1640 ($v_{-CH=CH2}$)

Weight-average molecular weight: 6620

| Analyzed elements | C | H | Si |
|---|---|---|---|
| Measured value (weight %) | 53.5 | 8.45 | 20.82 |
| Theoretical value (weight %) | 53.29 | 8.20 | 20.77 |

Comparative Example 5

Synthesis was executed in the same way as done for Comparative Example 1 except that 30.2 g (0.124 mol) of 2-(4-cyclohexyl ethyl)trichlorosilane was used instead of 20 g of vinyl trichlorosilane. As a result, 7.33 g of poly2-(4-cyclohexyl ethyl)silsesquioxane was obtained (74% of yield).

$^1$H-NMR (CDCl$_3$, internal standard substance: tetramethylsilane): δ (ppm) 0.45 to 0.85 (w, 3H, Si—CH$_2$—), 1.5 to 2.5 (m, 9H, —CH$_2$—), 4.7 to 5.0 (m, H, —CH=), 5.5 to 6.0 (m, 3H, =CH$_2$), IR (KBr tablet, cm$^{-1}$): 1050 ($v_{Si-O-Si}$), 1640 ($v_{-CH=CH2}$)

Weight-average molecular weight: 6620

| Analyzed elements | C | H | Si |
|---|---|---|---|
| Measured value (weight %) | 59.11 | 8.34 | 17.44 |
| Theoretical value (weight %) | 59.58 | 8.12 | 17.41 |

Example 1

The following will describe a synthetic example of an Si containing high molecular compound expressed by the general formula (1) where R$^1$ is an ethylene group, R$^2$ is a methyl group, a is 3, b is 0 and n is 30.

7.9 g of polyvinylsilsesquioxane acquired in Comparative Example 1, 14.6 g (0.12 mol) of trimethoxysilane and the Wilkinson complex were dissolved in 50 ml of a toluene solution in a 300 ml flask, and the resultant solution was heated to 60° C. for two hours while being stirred with a magnetic stirrer. The resultant solution was further heated to 90 to 95° C. and was stirred for ten hours.

The resultant solution was cooled down to the room temperature and was then dropped in 1 l of methanol, yielding a white precipitate. This precipitate was filtered and dissolved in 10 ml of toluene. The resultant solution was dropped in 500 ml of methanol for reprecipitation. The yielded precipitate was filtered and was subjected to vacuum drying at 40° C. for ten hours, yielding 9.66 g of the target product (78% of yield). The structure of the target product was checked in the same was as done for Comparative Example 1.

$^1$H-NMR (CDCl$_3$, internal standard substance: tetramethylsilane): δ (ppm) 0.2 to 0.35 (t, 4H, Si—CH$_2$—), 3.57 (s, 9H, O—CH$_3$)

IR (KBr tablet, cm$^{-1}$): 1080 ($v_{Si-O-Si}$),

Weight-average molecular weight: 12000

| Analyzed elements | C | H | Si |
|---|---|---|---|
| Measured value (weight %) | 29.21 | 6.32 | 27.34 |
| Theoretical value (weight %) | 29.83 | 6.52 | 27.9 |

Example 2

The following will describe a synthetic example of an Si containing high molecular compound expressed by the general formula (1) where R$^1$ is an ethylene group, R$^2$ is a methyl group, a is 3, b is 0 and n is 340.

Synthesis was executed using polyvinylsilsesquioxane produced in Comparative Example 2 in the same way as done for Example 1. As a result, 10.4 g of the target product (84% of yield) was acquired. The structure of the target product was checked in the same was as done for Comparative Example 1.

$^1$H-NMR (CDCl$_3$, internal standard substance: tetramethylsilane): δ (ppm) 0.2 to 0.35 (t, 4H, Si—CH$_2$—), 3.57 (s, 9H, O—CH$_3$)

IR (KBr tablet, cm$^{-1}$): 1080 ($v_{Si-O-Si}$).

Weight-average molecular weight: 132000

| Analyzed elements | C | H | Si |
|---|---|---|---|
| Measured value (weight %) | 29.52 | 6.13 | 27.18 |
| Theoretical value (weight %) | 29.83 | 6.52 | 27.9 |

Example 3

The following will describe a synthetic example of an Si containing high molecular compound expressed by the general formula (1) where R$^1$ is an ethylene group, R$^2$ is a methyl group, a is 2, b is 1 and n is 30.

Synthesis was executed using 12.7 g (0.12 mol) of dimethoxysilane instead of 14.6 g (0.12 mol) of trimethoxysilane in the same way as done for Example 1. As a result, 16.1 g of the target product (80% of yield) was acquired. The structure of the target product was checked in the same was as done for Comparative Example 1.

$^1$H-NMR (CDCl$_3$, internal standard substance: tetramethylsilane): δ (ppm) 0.07 to 0.15 (s, 3H, Si—CH$_3$), 0.2 to 0.35 (t, 4H, Si—CH$_2$—), 3.57 (s, 6H, O—CH$_3$)

IR (KBr tablet, cm$^{-1}$): 1080 ($_{Si-O-Si}$).

Weight-average molecular weight: 11000

| Analyzed elements | C | H | Si |
|---|---|---|---|
| Measured value (weight %) | 32.21 | 6.47 | 30.01 |
| Theoretical value (weight %) | 32.4 | 7.07 | 30.31 |

Example 4

The following will describe a synthetic example of an Si containing high molecular compound expressed by the general formula (1) where R$^1$ is an ethylene group, R$^2$ is a methyl group, a is 1, b is 2 and n is 30.

Synthesis was executed using 12.7 g (0.12 mol) of dimethylethoxysilane instead of 14.6 g of trimethoxysilane in the same way as done for Example 1. As a result, 15.7 g of the target product (85% of yield) was acquired. The structure of the target product was checked in the same was as done for Comparative Example 1.

$^1$H-NMR (CDCl$_3$, internal standard substance: tetramethylsilane): δ (ppm) 0.07 to 0.15 (s, 6H, Si—CH$_3$), 0.2 to 0.35 (t, 4H, Si—CH$_2$—), 1.05 to 1.3 (m, 4H, O—CH$_3$—), 3.52 to 3.9 (m, 6H, O—CH$_3$)

IR (KBr tablet, cm$^{-1}$): 1070 ($v_{Si-O-Si}$).

Weight-average molecular weight: 10600

| Analyzed elements | C | H | Si |
|---|---|---|---|
| Measured value (weight %) | 34.39 | 8.43 | 32.22 |
| Theoretical value (weight %) | 35.05 | 8.82 | 32.78 |

Example 5

The following will describe a synthetic example of an Si containing high molecular compound expressed by the general formula (1) where R$^1$ is an ethylene group, R$^2$ is an n-pentyl group, a is 3, b is 0 and n is 30.

Synthesis was executed using 34.9 g (0.12 mol) of dimethylethoxysilane instead of 14.6 g of tripenthoxysilane in the same way as done for Example 1. The structure of the target product was checked in the same was as done for Comparative Example 1.

$^1$H-NMR (CDCl$_3$, internal standard substance: tetramethylsilane): δ (ppm) 0.2 to 0.35 (t, 4H, Si—CH$_2$—), 0.8 to 1.25 (m, 9H, —CH$_3$)

0.8 to 1.25 (m, 18H, —CH$_2$—), 3.6 to 3.9 (m, 6H, O—CH$_2$)

IR (KBr tablet, cm$^{-1}$): 1070 ($v_{Si-O-Si}$).

Weight-average molecular weight: 22800

| Analyzed elements | C | H | Si |
|---|---|---|---|
| Measured value (weight %) | 57.23 | 9.17 | 14.38 |
| Theoretical value (weight %) | 57.97 | 9.47 | 14.27 |

Example 6

The following will describe a synthetic example of an Si containing high molecular compound expressed by the general formula (1) where R$^1$ is an ethylene group, R$^2$ is a methyl group, R$^3$ is an n-pexyl group, a is 2, b is 1 and n is 30.

Synthesis was executed using 34.9 g (0.12 mol) of n-hexyldimethoxysilane instead of 14.6 g of trimethoxysilane in the same way as done for Example 1. As a result, 25.4 g of the target product (75% of yield) was acquired. The structure of the target product was checked in the same was as done for Comparative Example 1.

$^1$H-NMR (CDCl$_3$, internal standard substance: tetramethylsilane): δ (ppm) 0.2 to 0.35 (t, 4H, Si—CH$_2$—), 0.8 to 1.25 (m, 3H, —CH$_3$)

0.8 to 1.25 (m, 10H, Si—CH$_2$, —CH$_2$—), 3.57 (m, 6H, O—CH$_3$)

IR (KBr tablet, cm$^{-1}$): 1060 ($v_{Si-O-Si}$).

Weight-average molecular weight: 15000

| Analyzed elements | C | H | Si |
|---|---|---|---|
| Measured value (weight %) | 47.48 | 8.56 | 21.37 |
| Theoretical value (weight %) | 47.02 | 9.07 | 21.99 |

Example 7

The following will describe a synthetic example of an Si containing high molecular compound expressed by the general formula (1) where R$^1$ is a propylene group, R$^2$ is a methyl group, a is 3, b is 0 and n is 28.

Synthesis was executed using 9.3 g of polyallylsilsesquioxane instead of 7.9 g of polyvinylsilsesquioxane in the same way as done for Example 1. As a result, 17.4 g of the target product (81% of yield) was acquired. The structure of the target product was checked in the same was as done for Comparative Example 1.

$^1$pH-NMR (CDCl$_3$, internal standard substance: tetramethylsilane): δ (ppm) 0.2 to 0.35 (t, 4H, Si—CH$_2$—), 1.2 to 1.75 (m, 2H, —CH$_2$—), 3.57 (s, 9H, O—CH$_3$)

IR (KBr tablet, cm$^{-1}$): 1050 ($v_{Si-O-Si}$).

Weight-average molecular weight: 12600

| Analyzed elements | C | H | Si |
| --- | --- | --- | --- |
| Measured value (weight %) | 33.12 | 6.88 | 25.77 |
| Theoretical value (weight %) | 33.46 | 7.02 | 26.08 |

Example 8

The following will describe a synthetic example of an Si containing high molecular compound expressed by the general formula (1) where $R^1$ is a hexylene group, $R^2$ is a methyl group, a is 3, b is 0 and n is 24.

Synthesis was executed using 13.5 g of polyhexa-5-enylsilsesquioxane instead of 7.9 g of polyvinylsilsesquioxane in the same way as done for Example 1. As a result, 22.1 g of the target product (86% of yield) was acquired. The structure of the target product was checked in the same was as done for Comparative Example 1.

IR (KBr tablet, $cm^{-1}$): 1060

Weight-average molecular weight: 12200

| Analyzed elements | C | H | Si |
| --- | --- | --- | --- |
| Measured value (weight %) | 41.73 | 7.83 | 21.64 |
| Theoretical value (weight %) | 41.99 | 8.22 | 21.82 |

Example 9

The following will describe a synthetic example of an Si containing high molecular compound expressed by the general formula (1) where $R^1$ is a 2-(4-cyclohexylene ethylene) group, $R^2$ is a methyl group, a is 3, b is 0 and n is 27.

Synthesis was executed using 16.1 g of poly2-(4-cyclhexylenyl)silsesquioxane instead of 7.9 g of polyvinyl-silsesquioxane in the same way as done for Example 1. As a result, 22.3 g of the target product (79% of yield) was acquired. The structure of the target product was checked in the same was as done for Comparative Example 1.

IR (KBr tablet, $cm^{-1}$): 1080 ($v_{Si-O-Si}$).

Weight-average molecular weight: 15100

| Analyzed elements | C | H | Si |
| --- | --- | --- | --- |
| Measured value (weight %) | 46.12 | 7.89 | 19.34 |
| Theoretical value (weight %) | 46.41 | 8.18 | 19.82 |

Example 10

A resist having the following composition was adjusted The following experiment was conducted under a yellow lamp.

| | |
| --- | --- |
| (a) Si containing high molecular compound obtained in Example 1 | 0.95 g |
| (b) cyclohexylmethyl(2-oxocyclohexyl)sulfonium trifluoromethane sulfonate (photoacid generator) | 0.05 g |
| (c) propylene glycol monoethyl ether acetate (solvent) | 4 g |

The mixture of (a), (b) and (c) was filtered using a 0.2 -μm teflon filter to adjust the resist. This resist was coated on a 3-in quartz substrate, and the resultant structure was baked on a hot plate at 80° C. for 60 seconds to form a thin film having a thickness of 1 μm. The results of the measurement of the resultant structure using ultraviolet-visible spectrometer (UV-365 ultraviolet-visible spectrometer manufactured by SHIMADZU CORPORATION) showed the acquired thin film with respect to ArF light (193.4 nm) had a high transmittance of 81%. It is apparent that the thin-film resist has a sufficient transparency.

Example 11

A resist having the following composition was adjusted The following experiment was conducted under a yellow lamp.

| | |
| --- | --- |
| (a) Si containing high molecular compound obtained in Example 1 | 0.95 g |
| (b) cyclohexylmethyl(2-oxocyclohexyl)sulfonium trifluoromethane sulfonate (photoacid generator) | 0.05 g |
| (c) propylene glycol monoethyl ether acetate (solvent) | 9 g |

The mixture of (a), (b) and (c) was filtered using a 0.2 -μm teflon filter to adjust the resist. This resist was coated on a 3-in silicon substrate, and the resultant structure was baked on a hot plate at 80° C. for 60 seconds to form a thin film having a thickness of 0.2 μm. The film-formed wafer was placed in close-contact type exposure experiment machine which had been sufficiently purged with nitrogen. A mask having a pattern drawn on quartz by chromium was put in close contact on the resist, and light from an ArF excimer laser (EX-746 manufactured by Lumonics Inc.) was irradiated on the resist through the mask. Immediately thereafter, the resultant structure was baked on a hot plate at 90° C. for 60 seconds, and was developed with methylisobutyl ketone for 60 seconds by immersion process after which the resultant structure was rinsed with methanol for 60 seconds. Consequently, only the unexposed portion of the resist film was dissolved into the developer, yielding a negative pattern. In this experiment, the line and space resolution of 0.25 μm was possible with the exposure energy of approximately 35 $mJ/cm^2$. The resultant pattern was observed with a scanning electron microscope (SEM: SE-41 manufactured by Hitachi Ltd.), and the results of the observation showed no remaining development, no pattern separation or the like.

Example 12

A resist having the following composition was adjusted The following experiment was conducted under a yellow lamp.

| | |
| --- | --- |
| (a) Si containing high molecular compound obtained in Example 3 | 0.95 g |
| (b) triphenyl sulfonium trifluoromethane sulfonate (photoacid generator) | 0.05 g |
| (c) propylene glycol monoethyl ether acetate (solvent) | 9 g |

The mixture of (a), (b) and (c) was filtered using a 0.2 -μm teflon filter to adjust the resist. This resist was coated on a 3-in silicon substrate, and the resultant structure was baked on a hot plate at 80° C. for 60 seconds to form a thin film having a thickness of 0.2 μm. The thin film was exposed using a KrF excimer laser (MEX excimer laser manufactured by NEC Corporation) as an exposure light source and a KrF excimer laser stepper (NA=0.42). Immediately thereafter, the resultant structure was baked on a hot plate at 90° C. for 60 seconds, and was developed with methylisobutyl ketone for 60 seconds by immersion process after which the resultant structure was rinsed with methanol for 60 seconds. Consequently, only the unexposed portion of the resist film was dissolved into the developer, yielding a negative pattern. In this experiment, the line and space resolution of 0.25 μm was possible with the exposure energy of approximately 40 mJ/cm$^2$. The resultant pattern was observed with a scanning electron microscope, and the results of the observation showed no remaining development, no pattern separation or the like.

As described above, because an Si containing high molecular compound according to this invention has Si atoms in the molecules, the oxygen resistant plasma property is excellent, and a photosensitive resin composition containing the Si containing high molecular compound of this invention and a photoacid generator is effective as a top layer of a multi-layered resist.

Further, since the photosensitive resin composition containing the Si containing high molecular compound of this invention and a photoacid generator shows a high sensitivity and resolution with respect to deep UV light whose wavelength is equal to or greater than 220 nm as well as deep UV light whose wavelength is equal to or smaller than 220 nm, this photosensitive resin composition is suitable as the base polymer of a photoresist.

What is claimed is:

1. An Si containing high molecular compound expressed by a general formula given below

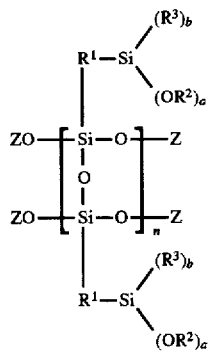

where $R^1$ represents a $C_2$-$C_8$ divalent saturated hydrocarbon group, $R^2$ represents a $C_1$-$C_8$ hydrocarbon group, $R^3$ represents a $C_1$-$C_8$ hydrocarbon group, Z represents a hydrocarbon atom or trimethylsilyl group, a is 1 to 3, b is 0 to 2 with a sum of a and b being 3, and n is a positive integer selected from 10 to 500.

2. A photosensitive resin composition containing at least an Si containing high molecular compound and a photoacid generator, said Si containing high molecular compound being expressed by a general formula given below

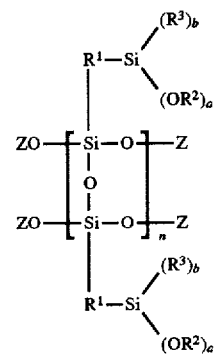

where $R^1$ represents a $C_2$-$C_8$ divalent saturated hydrocarbon group, $R^2$ represents a $C_1$-$C_8$ hydrocarbon group, $R^3$ represents a $C_1$-$C_8$ hydrocarbon group, Z represents a hydrocarbon atom or trimethylsilyl group, a is 1 to 3, b is 0 to 2 with a sum of a and b being 3, and n is a positive integer selected from 10 to 500, said photoacid generator serving to generate an acid by light irradiation and amplify a chemical change of a resist in a form of a catalytic reaction in a heat treatment after exposure.

3. The photosensitive resin composition according to claim 2, wherein a ratio of said Si containing high molecular compound contained in said photosensitive resin composition is 75 to 99.8 parts by weight.

4. The photosensitive resin composition according to claim 2, wherein a ratio of said photoacid generator contained in said photosensitive resin composition is 0.2 to 25 parts by weight.

5. The photosensitive resin composition according to claim 2, wherein a solvent solves a substance consisting of said Si containing high molecular compound and said photosensitive resin composition.

6. The photosensitive resin composition according to claim 2, wherein $R^1$ in said formula is a $C_2$-$C_8$ divalent saturated hydrocarbon group such as an ethylene group, propylene group, butylene group, pentylene group, hexylene group, heptylene group, octylene group, cyclopentylene group, cyclohexylene group, cycloheptylene group, cyclooctylene group, cyclopentyl ethylene group, or cyclohexyl ethylene group.

7. The photosensitive resin composition according to claim 2, wherein $R^2$ in said formula is a $C_1$-$C_8$ hydrocarbon group such as a methyl group, ethyl group, propyl group, butyl group, pentyl group, hexyl group, heptyl group, phenyl group, or methyl phenyl group.

8. The photosensitive resin composition according to claim 2, wherein $R^2$ in said formula is a $C_1$-$C_8$ hydrocarbon group such as a methyl group, ethyl group, propyl group, butyl group, pentyl group, hexyl group, heptyl group, phenyl group, or methyl phenyl group.

9. The photosensitive resin composition according to claim 2, wherein a sulfonium salt compound, such as triphenyl sulfonium trifluoromethane sulfonate, triphenyl sulfonium trifluoromethane antimonate, triphenyl sulfonium benzosulfonate, cyclohexyl methyl (2-oxocyclohexyl) sulfonium trifluoromethane sulfonate, dicyclohexyl (2-oxocyclohexyl) sulfonium trifluoromethane sulfonate, dicyclohexylsulfonyl cyclohexanone, or dimethyl (2-oxocyclohexyl) sulfonium trifluoromethane sulfonate, iodonium salt, such as diphenyl iodonium trifluoromethane sulfonate, N-hydroxy succinimide trifluoromethane sulfonate, and the like are used singly or in combination of two or more kinds thereof as said photoacid generator.

10. The photosensitive resin composition according to claim 2, wherein methyl cellosolve acetate, ethyl cellosolve acetate, propylene glycol monoethyl ether acetate, methyl lactate, ethyl lactate, 2-methoxyethyl acetate, 2-ethoxyethyl acetate, methyl pyruvate, ethyl pyruvate, 3-methoxymethyl propionate, N-methyl-pyrrolidinone, cyclohexanone, cyclopentanone, methylethyl ketone, 1,4-dioxane, ethylene glycol monoethyl ether acetate, ethylene glycol monomethyl ether, ethylene glycol monoisopropyl ether, diethylene glycol monoethyl ether, diethylene glycol monomethyl ether, and the like are used singly or in combination of two or more kinds thereof as a solvent.

* * * * *

UNITED STATES PATENT AND TRADEMARK OFFICE
CERTIFICATE OF CORRECTION

PATENT NO. : 5,723,257
DATED : March 3, 1998
INVENTOR(S) : Shigeyuki Iwasa It is certified that error appears in the above-identified patent and that said Letters Patent is hereby corrected as shown below:

Claim 1, Col. 13, line 57, "$R^s$" should be --$R^3$--.

Claim 8, Col. 14, line 51, "$R^2$" should be --$R^3$--.

Signed and Sealed this

Eighth Day of September, 1998

Attest:

BRUCE LEHMAN

*Attesting Officer*    *Commissioner of Patents and Trademarks*